United States Patent

Hessinger

[15] 3,662,086

[45] May 9, 1972

[54] SEMICONDUCTOR PACKAGE

[72] Inventor: Philip S. Hessinger, W. Caldwell, N.J.

[73] Assignee: National Beryllia Corp., Haskell, N.J.

[22] Filed: May 25, 1970

[21] Appl. No.: 40,286

[52] U.S. Cl. ........................174/52 S, 317/234 G, 339/17 R, 339/112 R

[51] Int. Cl. ........................H05k 5/04

[58] Field of Search ..................317/100, 101, 234 A, 234 G; 114/52 S, 68.5; 339/17 R, 17 C, 17 D, 17 E, 17 CF, 17 T

[56] References Cited

UNITED STATES PATENTS 3,361,868 1/1968 Bachman..............................174/52 S

FOREIGN PATENTS OR APPLICATIONS 1,468,888 France..............................317/234 A

*Primary Examiner*—Richard E. Moore
*Assistant Examiner*—Terrell P. Lewis
*Attorney*—Greene & Durr

[57] ABSTRACT

A ceramic disk for sealing the chamber built onto a metal stud acting as a heat sink, is provided with a surface that will be the interior surface when sealed, which acts as the substrate for the semiconductor or electronic circuit. The circuit on said disk can be completed and tested before it is sealed onto the stud.

5 Claims, 3 Drawing Figures

PATENTED MAY 9 1972

3,662,086

*INVENTOR*
P.S. Hessinger

*by* Greene and Durr

ATTORNEYS

SEMICONDUCTOR PACKAGE

This invention relates to a semiconductor package of the type which includes a semiconductor with electrical connections or a circuit secured within a sealed chamber of a metallic stud, the circuit being insulated from electrical contact with the stud, but connected to provide high heat conductivity to the stud for the dissipation of excess heat developed by operation of the device.

Devices of the general type described are well known and generally include a high purity or tellurium copper stud, to the head of which is brazed a ceramic chip, the upper surface of the ceramic chip is provided with a transistor and metallized pads, electrically conducting leads are united, by brazing for example, to the metallized pads and then, to protect the circuit from the elements, a ceramic cap is provided to extend over the ceramic chip circuit and is resistance welded or soldered or otherwise bonded to an extension of the metal stud. In many cases, the lead wires must also pass through and be sealed to the ceramic cap.

Among the objects of the present invention is to provide a semiconductor package of a construction which eliminates one or more of the expensive parts of such a device and simultaneously eliminates one or more of the process steps involved in assembling such a package.

Among other objects of the invention is to provide a package of a construction which enables one to separately construct and finally test the electronic circuit before going to the trouble of assembling it in the final package.

The objects of the invention are obtained by providing a metal, heat dissipating stud having a recessed head comprising an upper annular flange which is adapted to be closed and sealed with a ceramic disk to provide a closed chamber between the lower surface of the disk and the shank portion of the stud, and providing a ceramic disk adapted to close said chamber, the semiconductor and metallized pads therefor being formed on the lower or inner surface of the ceramic sealing disk. Suitable leads extend from the lower surface of the ceramic sealing disk and through said disk to the outer exposed surface thereof. All the circuit elements and leads necessary for testing the circuit are applied to the ceramic sealing disk before it is sealed into the stud.

The stud may be of any metal or alloy used for such studs, such as high purity copper or aluminum, or high heat conducting copper or aluminum alloys.

The sealing disk can be any ceramic material ordinarily used in a substrate for a circuit or circuit element. A preferred type of disk is one made of beryllia or one containing a high proportion of beryllia in order to obtain the benefits of the high heat conductivity thereof. The edges of the ceramic disk may be polished to obtain better surface to surface contact with the metal flange of the stud.

The ceramic sealing disk can be sealed to the flange of the stud by spinning, by heat-shrink fitting, by soldering and/or by cementing with a resin.

Further objects and features of the invention will be apparent from the reading of the subjoined specification and claims and from a consideration of the accompanying drawings illustrating the invention.

Figure 2:
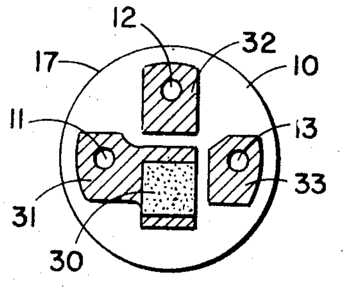
FIG. 2 is a bottom view of the ceramic disk of FIG. 1.

As illustrated, the device of the invention comprises one ceramic disk 10 and a stud 20, which contains an annular flange 21 projecting from the head 22 thereof, so as to form a cup-shaped chamber with the head. Preferably, the flange 21 is integrally formed on the head 22 of the stud 20, as shown, but it can be separately formed and united to the head, if desired. Preferably also, the flange 21 includes an internal annular shoulder 22 for positioning the disk 10 within the flange, although the shoulder 26 can also be omitted, if desired. The lower or shank portion 23 of the stud 20 can be threaded in the portion 24 if desired.

The disk 10 contains a predetermined number of holes 11, 12, 13 into which are sealed the metal pins 14, 15, 16, by brazing. Such metal pins 14–16 are usually made of nickel and the process of sealing said pins in the ceramic disks are known in the art. The underside of the disk 10 is provided with a semiconductor 30 and circuit elements 31, 32, 33 therefor. Said disk has a cylindrical rim 17 adapted to fit within the wider part of flange 21. Processes of forming circuit elements on the surface of a ceramic disk and securing a semiconductor thereto are also known in the art.

Figure 1:
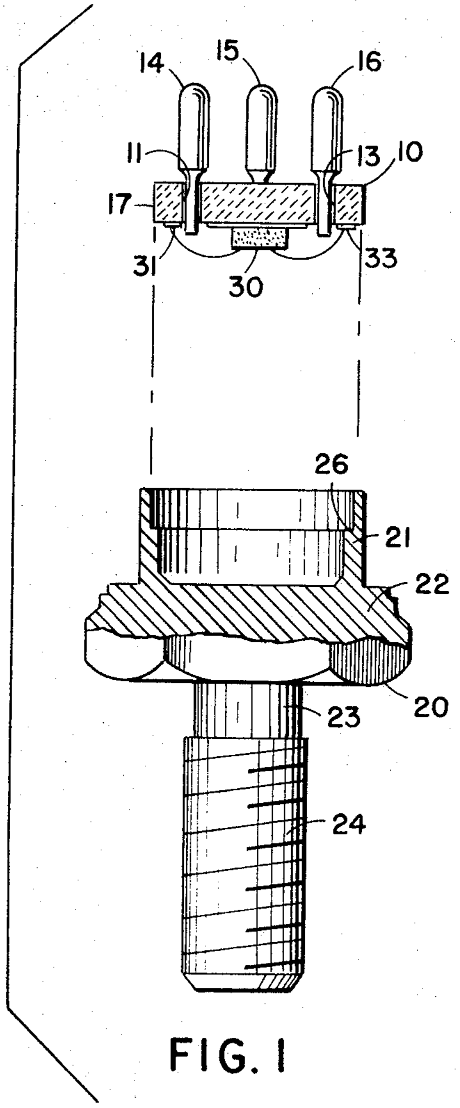
FIG. 1 is an exploded view, partly in cross-section, of the parts which made up the package of the invention.
Figure 3:
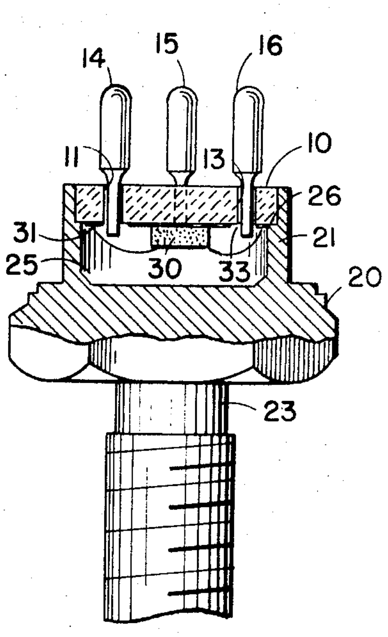
FIG. 3 is a view partly in cross-section of the assembled package.

To produce the device shown in FIGS. 1 and 3, a one piece aluminum stud is provided with the flanged head 21, as shown, and a disk 10 made by firing a composition consisting essentially of BeO is selected, which has a rim 17 adapted to fit snugly within the top part of flange 21 while resting on shoulder 26. A suitable electronic circuit is provided on the underside of disk 10, the semiconductor is attached by brazing and the leads 14–16 are also sealed in holes 11–13 respectively. Thereafter, the circuit on disk 10 is tested and, if satisfactory, the disk is inserted in flange 21 and sealed by spinning, with or without the aid of solder, brazing metal or resin cement. The intimate contact between the rim 17 of the disk 10 and the flange 21, together with the high heat conductivity of the BeO of the disk 10 provides adequate heat dissipation for the operation of the circuit, whereas the circuit elements are protectively sealed within the chamber as shown in FIG. 3. As indicated above, other types of ceramic disks can be employed, such as those made of alumina, insulating ferrites, various glasses, silicas, zirconia, magnesia, silicates, etc., and mixtures thereof. The choice of the material for the disk can depend on the heat that will have to be dissipated and various other factors.

I claim:

1. A semiconductor package combination consisting essentially of an electrically insulating disk and a heat conducting metal stud
   - said stud having a head which includes an annular flange adapted to form a cup shaped chamber with the head,
   - said disk being shaped to fit snugly within the upper portion of said annular flange and having a semiconductor circuit formed on the underside thereof,
   - said disk being sealed within said annular flange so that said circuit is held out of contact with the stud, and
   - means connecting the circuit on the underside of said disk to the outside thereof.

2. The semiconductor package as claimed in claim 1 wherein said annular flange is formed as an integral part of the metal stud.

3. The semiconductor package as claimed in claim 1 wherein said annular flange includes an internal shoulder adapted to position the disk therein.

4. The semiconductor as claimed in claim 1 wherein said disk consists essentially of beryllium oxide.

5. A process of making a semiconductor package combination of the type which includes a semiconductor and circuit therefor formed on an electrically insulating disk sealed within a chamber formed on a metal, heat-sink stud, the steps comprising
   - providing a stud having a head from which projects an annular flange forming a cup-like chamber with the head,
   - providing an electrically insulating ceramic disk containing at least one hole extending from the top to the bottom surface thereof and with a rim adapted to fit snugly within the top portion of the flange of said stud,
   - forming a semiconductor circuit on the bottom surface of said disk,
   - brazing at least one conductor element in said hole and connecting said conductor to said semiconductor circuit,
   - testing said circuit, and
   - thereafter sealing said disk in the top portion of said annular flange whereby the bottom surface thereof and the semiconductor circuit is sealed within said cup-like chamber.

* * * * *